United States Patent [19]
Abe et al.

[11] Patent Number: 5,641,945
[45] Date of Patent: Jun. 24, 1997

[54] CONTACTING STRUCTURE WITH RESPECT TO SPHERICAL BUMP

[75] Inventors: Shunji Abe, Yokohama; Kazumi Uratsuji, Tokyo, both of Japan

[73] Assignee: Yamaichi Electronics Co., Ltd., Tokyo, Japan

[21] Appl. No.: 524,825

[22] Filed: Sep. 7, 1995

[30] Foreign Application Priority Data

Sep. 8, 1994 [JP] Japan .................................. 6-240601

[51] Int. Cl.[6] ........................................................ H05K 1/16
[52] U.S. Cl. ........................ 174/261; 114/260; 361/772; 361/774; 439/82
[58] Field of Search ......................... 174/261, 262, 174/260, 250; 361/774, 772, 791, 768; 439/81, 82, 78, 74, 75, 65; 437/183

[56] References Cited

U.S. PATENT DOCUMENTS

| | | | |
|---|---|---|---|
| 3,530,422 | 9/1970 | Goodman | 339/17 |
| 5,227,812 | 7/1993 | Watanabe et al. | 346/140 R |
| 5,349,495 | 9/1994 | Visel et al. | 361/774 |
| 5,386,344 | 1/1995 | Beaman et al. | 361/785 |
| 5,398,166 | 3/1995 | Yonezawa et al. | 361/784 |
| 5,410,807 | 5/1995 | Bross et al. | 29/843 |
| 5,484,964 | 1/1996 | Dawson et al. | 174/261 |
| 5,489,750 | 2/1996 | Sakemi et al. | 174/261 |

*Primary Examiner*—Laura Thomas
*Attorney, Agent, or Firm*—Wenderoth, Lind & Ponack

[57] ABSTRACT

A contacting structure with respect to a spherical bump in which the spherical bump is to be contacted with a contact pin, the contact pin includes a contacting portion supported by a resilient support element, and the contacting portion is arranged in opposite relation to that part of a spherical surface of the spherical bump other than a lower-most point thereof. The contacting portion has a projection capable of pressing into the spherical surface of the spherical bump, and also has a pressure receiving surface for setting an amount by which the projection presses into the spherical surface.

15 Claims, 7 Drawing Sheets

FIG.11

CONTACTING STRUCTURE WITH RESPECT TO SPHERICAL BUMP

BACKGROUND OF THE INVENTION

This invention relates to a contacting structure with respect to a spherical bump represented by a BGA type package.

Figure 1:
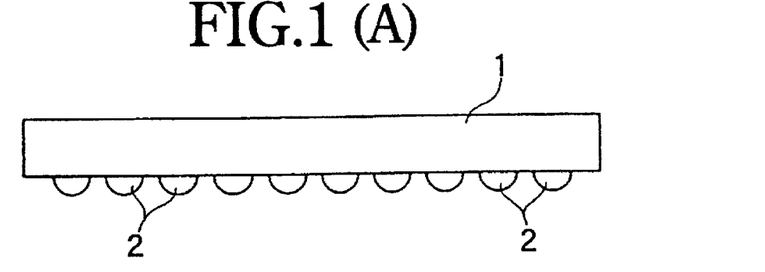
FIG. 1(A) is a side view of a BGA type IC package.
FIG. 1(B) is a side view of another BGA type IC package.
FIG. 1(C) is a bottom view of those two packages.

As shown in FIGS. 1(A), 1(B) and 1(C), the BGA type IC package has a plurality of spherical bumps 2 disposed on a lower surface of an IC package body 1. Each of the spherical bumps 2 exhibits either a semi-spherical shape as shown in FIG. 1(A) or a spherical shape as shown in FIG. 1(B). The spherical bumps are made of a metal having a low melting point such as a soldering material or the like. According to a method often employed, the spherical bumps are loaded directly on a wiring board and a lower dead point portion (i.e. bottom-most portion) of each spherical bump is welded to a wiring pattern.

Since the BGA type IC package is mounted by welding the lower dead point portions of the spherical bumps to a wiring pattern or the like as previously described, it is required that a socket for use of aging tests be such as to not subject the lower dead point portions of the spherical bumps to damage.

To fulfill this requirement, Japanese Laid-Open Patent Application Hei 6-203926 proposes a contacting structure in which contact pins, which are disposed on a socket body, are each provided with a resilient support element and a distal end portion at a distal end of the resilient support element such that the contacting portion is placed opposite a lower spherical surface of the spherical bump. The contacting portion is provided with an escape portion in non-contact relation with the lower-most point portion of the spherical bump. Further, the contact pin includes a contacting end which is to be contacted with an external area of the lower-most dead point of the spherical bump around the escape portion.

In the above conventional device, since the contact pin can provide an electrical contact either at a plurality of points or in an annular fashion about the lower dead point portion of the spherical bump around the escape portion while effectively preventing an occurrence of damage to the lower dead point portion by the escape portion on the distal end of the resilient support element providing a non-contacting state with the lower dead point portion of the spherical bump, the problem of damaging the lower-most point of the spherical bump can be solved effectively.

However, the conventional device has such shortcomings that, since the spherical bump is softened because the aging test is usually carried out at a comparatively high temperature or because the aging test is sometimes carried out for a long time, the contacting end of the contact pin, which contacts the spherical bump under pressure, tends to overly pierce into the bump, thereby to leave a grave piecing trace in the bump. As a consequence, merchandise value is badly jeopardized.

The present invention has been accomplished in view of the above problems. It is, therefore, an object of the present invention to provide a contacting structure with respect to a spherical bump, in which an occurrence of damage to a spherical bump can be minimized while ensuring a reliable electrical contact between an IC package and a contact pin of a socket.

To achieve the above object, from one aspect of the present invention, there is essentially provided a contacting structure with respect to a spherical bump in which the spherical bump is to be contacted with a contact pin, the contact pin includes a contacting portion supported by a resilient support element, and the contacting portion is arranged in opposite relation to that part of a spherical surface of the spherical bump other than a lower-most point portion. The contacting portion has a projection capable of biting (or pressing) into the spherical surface of the spherical bump, and also has a pressure receiving surface for setting a biting amount of the projection (i.e. an amount by which the projection can press into the spherical surface).

From another aspect of the present invention, there is also provided contacting structure with respect to a spherical bump in which the spherical bump is to be contacted with a contact pin, the contact pin includes a plurality of contacting portions supported by a resilient support element, and the contacting portions are arranged in opposite relation to that part of a spherical surface of the spherical bump other than a lower-most point portion. The contacting portions each have a projection capable of biting (or pressing) into the spherical surface of the spherical bump, and also has a pressure receiving surface for setting a biting amount of the projection.

The above and other objects and attendant advantages of the present invention will be apparent to those skilled in the art from a reading of the following description and claims in conjunction with the accompanying drawings which constitute part of this disclosure.

DETAILED DESCRIPTION OF THE EMBODIMENT

As shown in FIGS. 2(A), 2(B), 3 and 4, a contact pin 3 has a vertically extending resilient support element 4 and a contacting portion 5 defined on a distal end thereof.

In the illustrated embodiment, a pair of linear plates 4a, 4b are juxtaposed such that surfaces of the linear plates 4a, 4b closely confront each other, thereby defining the resilient support element 4. The contacting portion 5 is formed on the distal ends of the linear plates 4a, 4b. Lower ends of the linear plates 4a, 4b are connected at side surfaces thereof via a connected portion 6. A male terminal 7 extends downwardly from a lower end of this connected portion 6. A press-fit claw 8 is formed on a basal portion of the male terminal 7. The contact pin 3 is implanted into a socket body 9 through the press-fit claw 8 such that the male terminal 7 is allowed to extend downwardly of a lower surface of the socket body 9. The linear plates 4a, 4b (i.e., resilient support element 4) are received in a receiving hole 10 formed in the socket body 9, such that the contacting portion 5 defined on the distal ends of the linear plates 4a, 4b is allowed to project upwardly of an upper surface of the socket body through an upper open face of the receiving hole 10.

The contact pin is integrally formed by blanking and bending a plate material.

Figure 4:
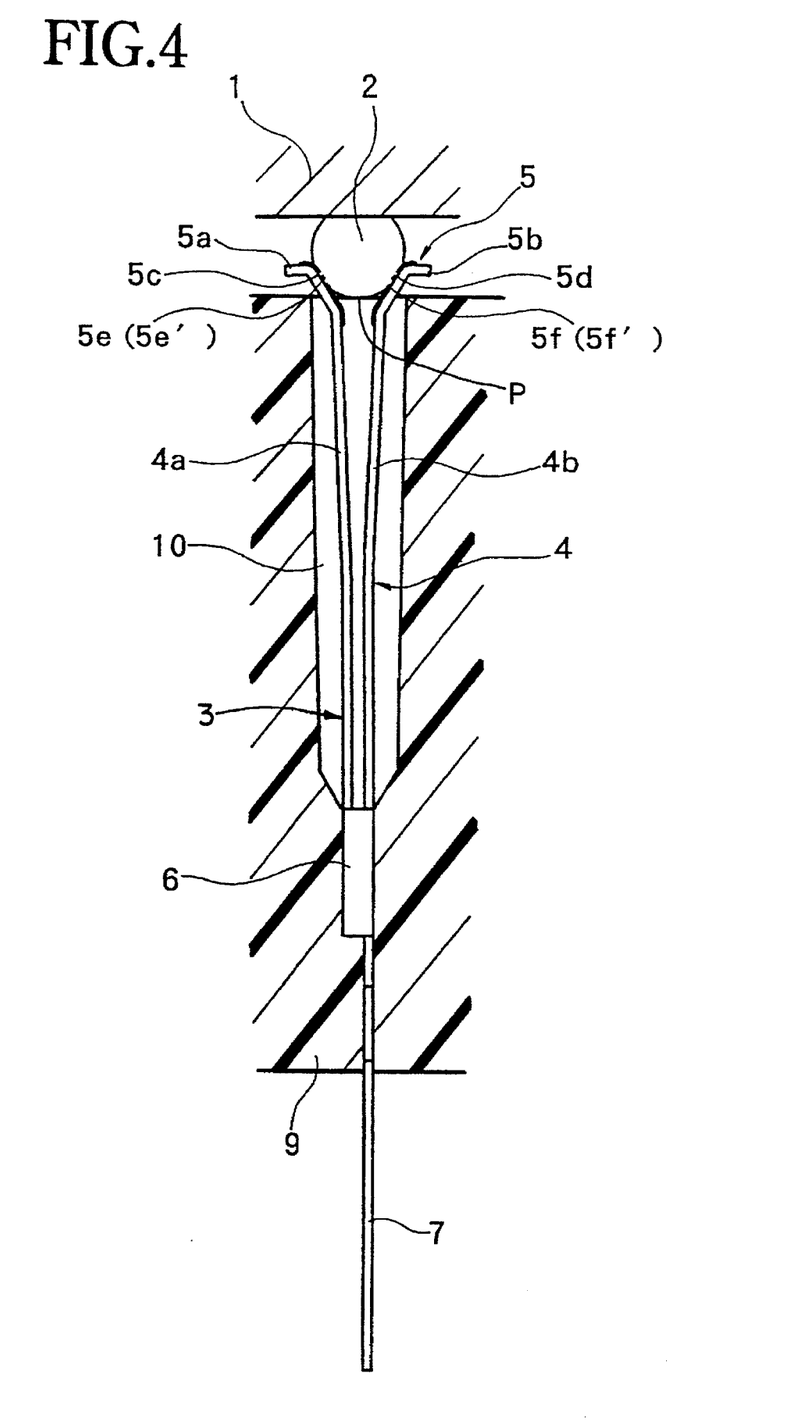
FIG. 4 is a sectional view, on an enlarged scale, showing the contact pin implanted in a socket body and being in contact with a spherical bump.

The contacting portion 5 includes pressure receiving plates 5a, 5b which are formed respectively on distal ends of the linear plates 4a, 4b by blanking and bending. The pressure receiving plates 5a, 5b are inclined at a certain elevation angle α so that the pressure receiving plates 5a, 5b are slanting upwardly and outwardly away from each other. As shown in FIG. 4, the pressure receiving plates 5a, 5b are arranged so as to face the part of the spherical surface of the bump 2 other than the lower dead point portion (i.e. the bottom-most point) p of the spherical bump 2. For example, a plurality of such spherical bumps 2 are arranged on a lower surface of a BGA type IC package body 1.

As one example, the pressure receiving plates 5a, 5b (i.e., contacting portion 5) are arranged in symmetrical relation, and the respective pressure receiving plates 5a, 5b face each other at diametrically opposite positions of a lower semi-spherical surface of the spherical bump 2.

A mating surface of the pressure receiving plate 5a with respect to the spherical bump 2 is defined by a pressure receiving surface 5c, while a mating surface of the pressure receiving plate 5b with respect to the spherical bump 2 is defined by a pressure receiving surface 5d. Projections 5e, 5f are formed on the pressure receiving surfaces 5c, 5d, respectively.

For example, the projections 5e, 5f may be (or ribs) 5e', 5f' extending in a direction of a longitude line passing generally through the lower dead point of the spherical bump 2. The ridges 5e', 5f' are arranged in such a manner as to extend along a vertical center line of the pressure receiving plates 5a, 5b and the linear plates 4a, 4b. Therefore, the left and right pressure receiving surfaces 5c, 5d are arranged on both sides of the ridges 5e', 5f' (both sides of the spherical bump in a direction of its longitude line).

Figure 2:
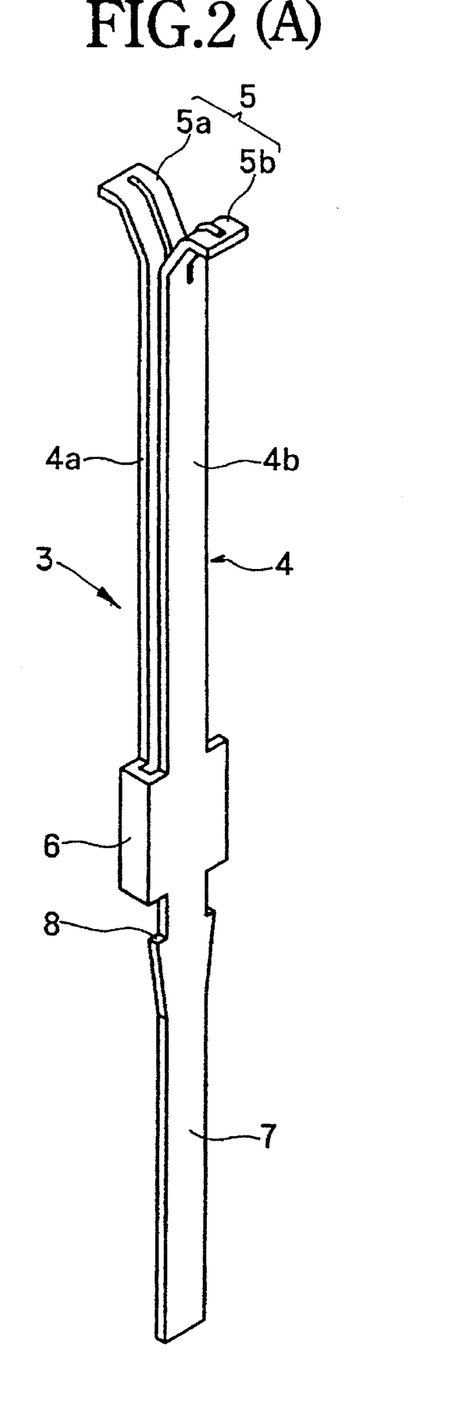
FIG. 2(A) is a perspective view showing one example of a contact employed in the present invention.
FIG. 2(B) is an enlarged view of a contacting portion of the contact pin.
Figure 3:
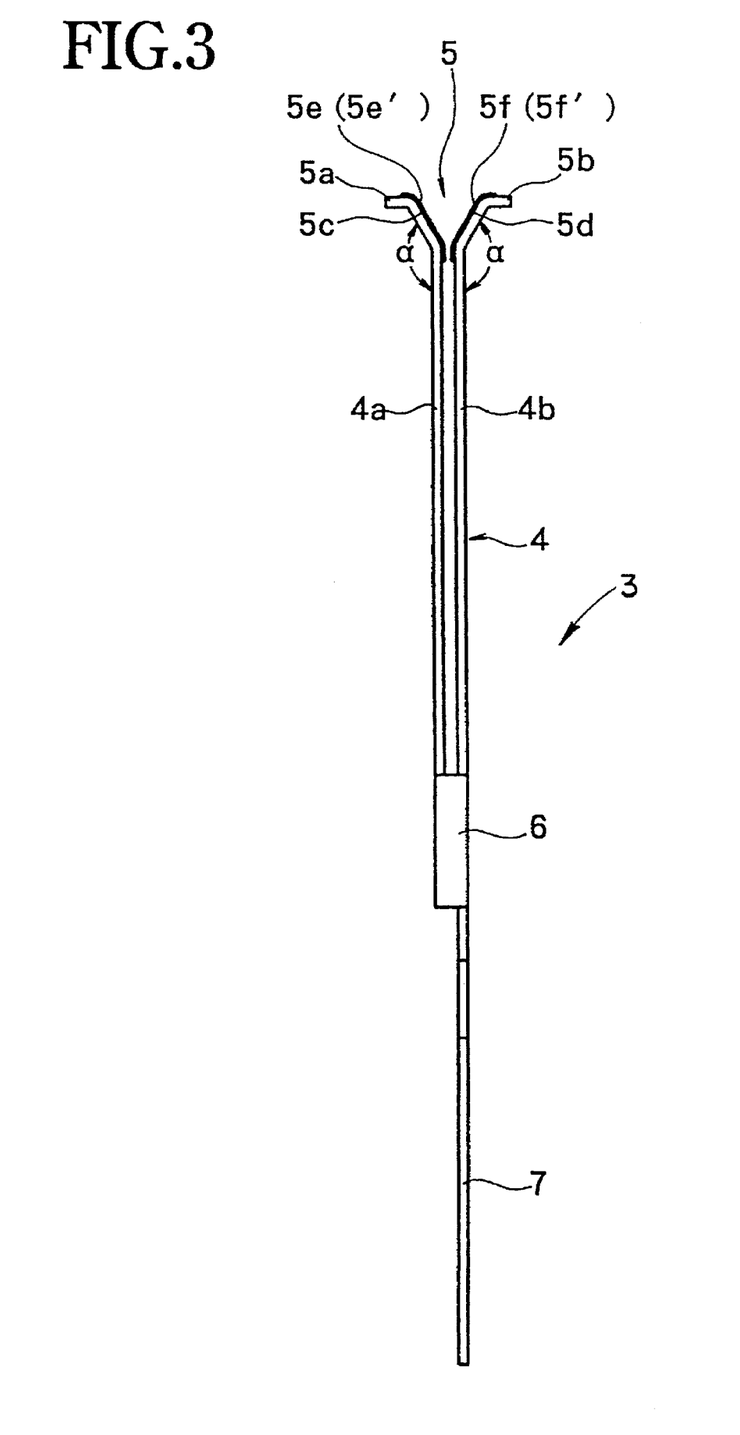
FIG. 3 is a side view of the contact pin.
Figure 5:
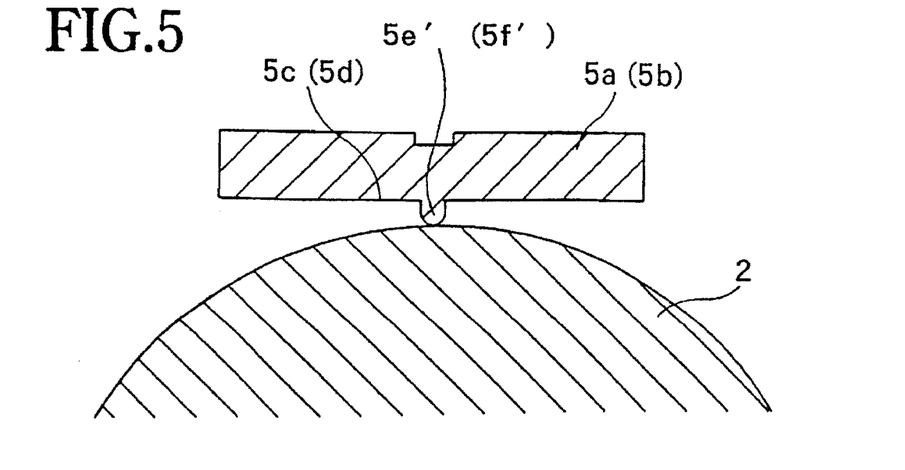
FIG. 5 is a transverse sectional view, on an enlarged scale, showing an early-stage contacted-state between a projection and the spherical bump.

In FIGS. 2 to 4, the ridges 5e', 5f' are of an arcuate shape in a transverse sectional view as shown in FIG. 5.

Figure 10:
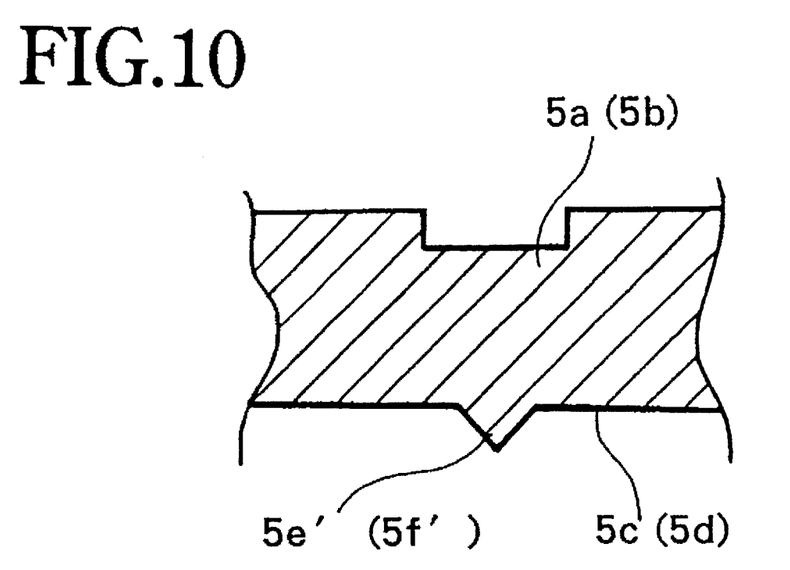
FIG. 10 is a transverse sectional view showing a modified embodiment of the projection.

In FIG. 10, the ridges 5e', 5f' are of a triangular shape having a sharp ridge line in a transverse sectional view.

Figure 11:
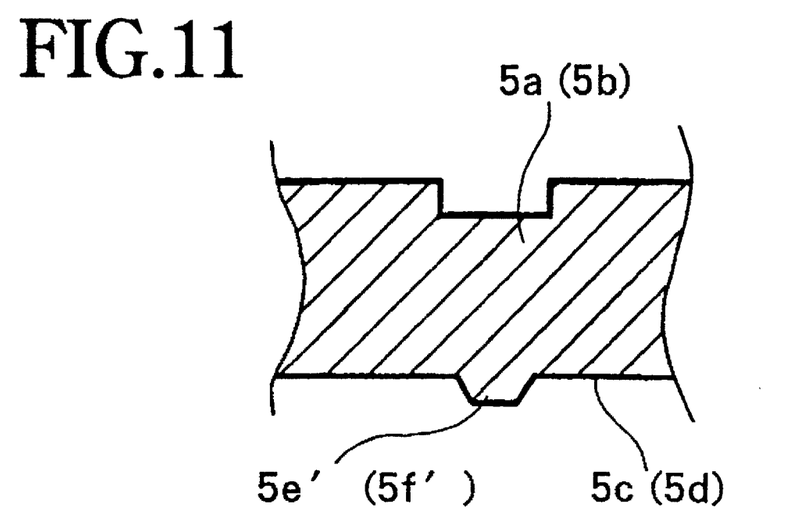
FIG. 11 is a transverse sectional view showing another modified embodiment of the projection.

In FIG. 11, the ridges 5e', 5f' are of a shape having a flat top face such as a trapezoidal shape.

The ridges 5e', 5f' of any one of the above-mentioned shapes are formed by an embossing press. In the alternative, the pressure receiving plates 5a, 5b of the pressure receiving plate 5 are subjected to hammering over their entire surfaces to form the ridges 5e', 5f', or the ridges 5e', 5f' are formed by cutting.

In the illustrated embodiments, the ridges 5e', 5f' are formed in such a manner as to extend in the direction of the longitudinal line of the pressure receiving plates 5a, 5b which are passes generally through the lower dead point of the spherical bump 2. In the alternative, the ridges 5e', 5f' may be formed in such a manner as to extend in a direction transverse to the longitude line of the pressure receiving plates which passes through the lower dead point p of the spherical bump 2 (for example, in a direction of a latitude line).

The projections 5e, 5f are not limited to the arrangement in which they extend in the vertical direction, but rather can extend in a transverse direction or a slant direction. Another arrangement is possible in which a small projection having a semi-spherical shape or the like is formed and pressure receiving surfaces 5c, 5d are formed on a basal portion of this small projection.

In the case where the projections 5e, 5f are the ridges 5e', 5f', the ridges are linearly formed, for example, and allowed to slantwise extend at the elevation angle α, so that the ridges are caused to bite (or press) into the surface of the spherical bump at the midway of the extension line of the ridges. At that time, opposite ends of the ridges 5e', 5f' extend in a tangential direction with respect to and away from the spherical surface. An arrangement is also acceptable in which the pressure receiving plates 5a, 5b and the ridges 5e', 5f' are curved to from convexly curved surfaces on their confronting sides.

In the case where the projections 5e, 5f are semi-spherical small projections, they are arranged at a contacting point with respect to the spherical surface of the spherical bump, so that the entire small projections can bite (or press) into the bump.

In any case, the biting amount of the projections 5e, 5f (i.e. the amount by which the projections can press into the spherical bump) is set by the pressure receiving surfaces 5c, 5d.

More specifically, as shown in FIG. 4, the spherical bump 2 is received in a space between the pressure receiving plates 5a, 5b. Upon depression of the IC package body 1, the spherical bump 2 is pushed into the space between the pressure receiving plates 5a, 5b as shown in FIGS. 4, 5, 6 and 7. As a consequence, the spherical bump 2 causes the pressure receiving plates 5a, 5b to move away from each other while shifting the resilient support element 4 (linear plates 4a, 4b) outwardly against the resiliency thereof. The projections 5e, 5f are caused to bite (or press) into the spherical surface of the spherical bump 2 by a restoring resilient force of the resilient support element 4. With the progress of the biting (or pressing) of the projections 5e, 5f into the spherical bump 2, the pressure receiving surfaces 5c, 5d of the pressure receiving plates 5a, 5b are brought into abutment with the spherical surface of the spherical bump 2, thereby restraining further progress of the biting (or pressing) of the projections 5e, 5f into the spherical bump 2.

Figure 6:
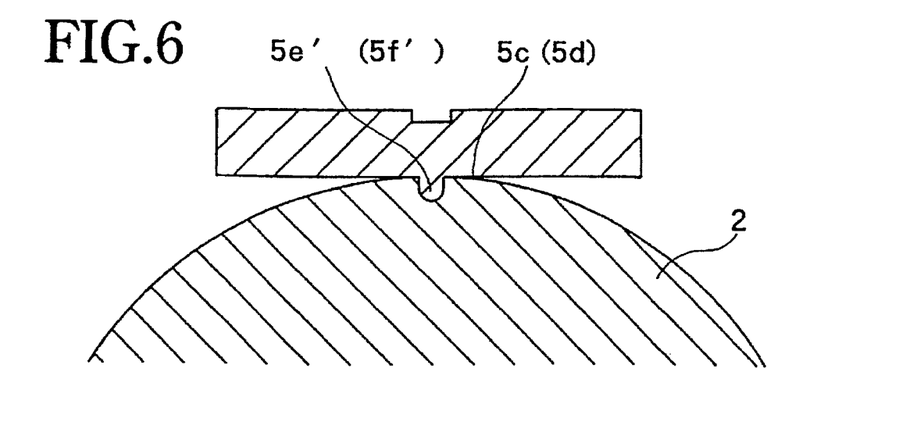
FIG. 6 is a transverse sectional view, on an enlarged scale, showing a final stage contacted-state or midway contacted-state between the projection and the spherical bump.
Figure 7:
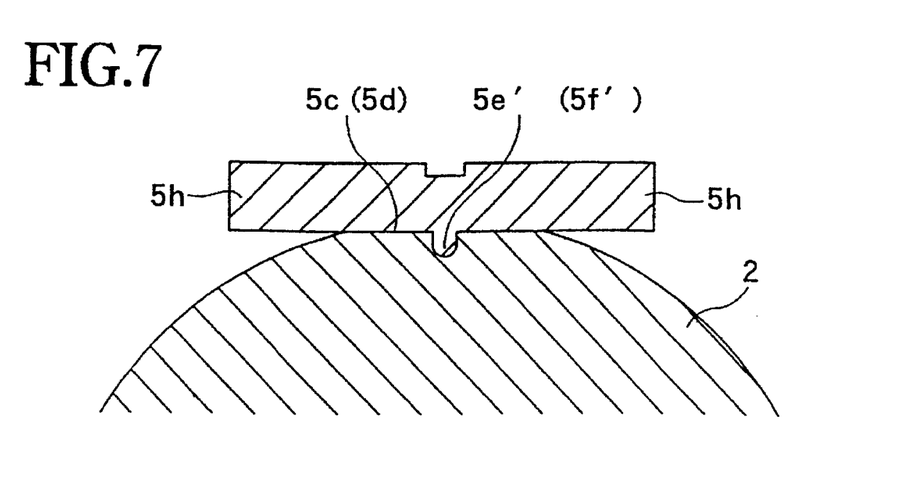
FIG. 7 is a transverse sectional view, on an enlarged scale, showing a final stage contacted-state between the projection and the spherical bump.

Depending on the degree of softening of the spherical bump 2 or depending on the foregoing plus the magnitude of the resilient force of the resilient support element 4, the pressure receiving surfaces 5c, 5d are, as shown in FIG. 6, brought to be stationary either at positions where the pressure receiving surfaces 5c, 5d reach the spherical surface, or at positions where the pressure receiving surfaces 5c, 5d do not reach the spherical surface, or at positions where the spherical surface is slightly compressed by the pressure receiving surfaces 5c, 5d as shown in FIG. 7.

In either of FIGS. 6 and 7, wing portions 5h of the pressure receiving plates 5a, 5b (pressure receiving surfaces 5c, 5d) disposed on opposite sides of the projections 5e, 5f are expanded in the tangential direction with respect to and spaced away from the spherical surface.

Figure 8:
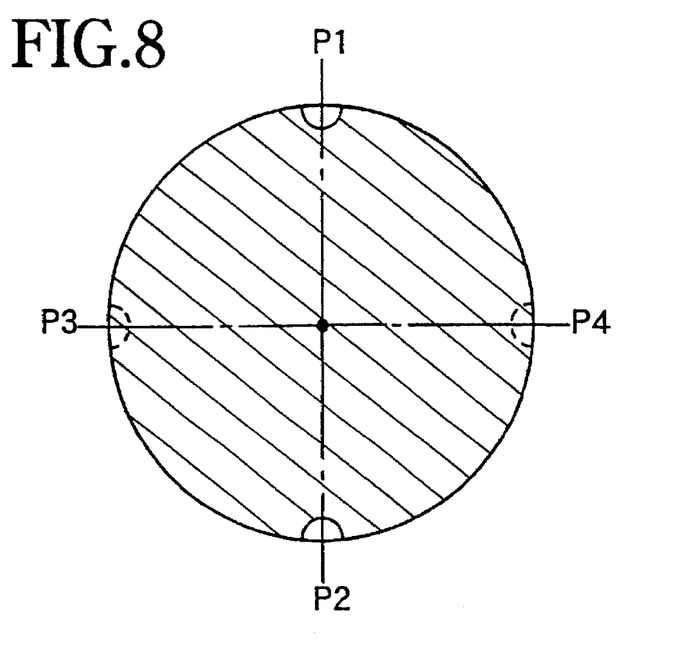
FIG. 8 is a transverse sectional view exemplifying a contacting position of the projection with respect to the spherical bump.
Figure 9:
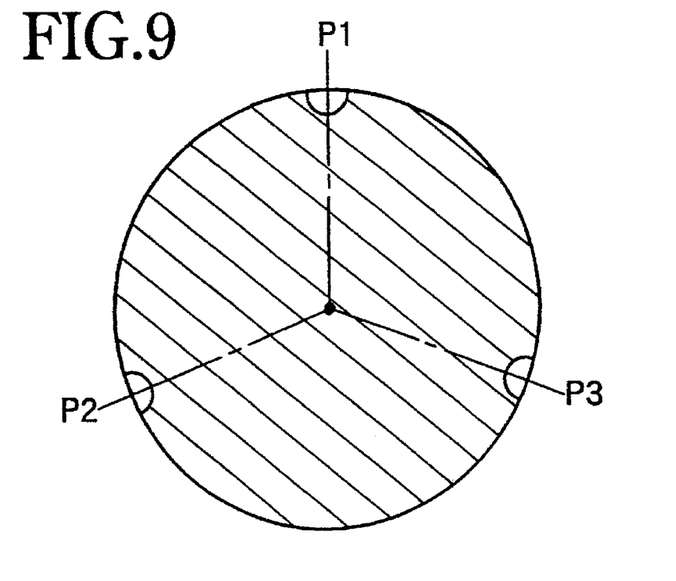
FIG. 9 is a transverse sectional view exemplifying another contacting position of the projection with respect to the spherical bump.

In FIGS. 2 to 4, the pressure receiving plates 5a, 5b and the ridges 5e', 5f' are arranged in positions opposite by 180 degrees (i.e. diametrically opposite) to each other so that electrical contact can be made at two points P1 and P2 which divide the circumference of the spherical surface into two equal parts as shown in FIG. 8. In the alternative, they may be arranged such that electrical contact can be made in a well-balanced manner at three points P1, P2 and P3 which divide the circumference of the spherical surface into three equal parts as shown in FIG. 9.

Also, as indicated by broken lines in FIG. 8, four projections 5e, 5f may be brought into contact with the spherical surface at positions P1 to P4 which divide the spherical surface into four equal parts.

At present, in order to be good for applying to the BGA type IC package, the height of each projection is about 0.05 mm, the width (width of a basal portion in the short direction in case of the ridge, and diameter of a basal portion in case of the small projection having a semi-spherical shape or the like) is about 0.05 mm, and a short width of the pressure receiving surface 5c, 5d is about 0.7 mm. The projections, etc. of the present invention are small enough to meet the above-mentioned conditions.

As mentioned above, the projections are caused to bite (or press) into an outer layer portion of the spherical bump by a resilient force of the resilient element, and this biting amount (i.e. the amount by which the projections can press into the spherical bump) can be adequately set by the pressure receiving surfaces. The projection is caused to appropriately bite (or press) into the outer layer portion of the spherical bump due to coaction between the projection and the pressure receiving surface, and therefore, a reliable electrical contact can be obtained. In addition, a biting amount of the projection with respect to the bump surface and a trace of damage caused by the biting can be minimized. Thus, a favorable merchandise quality can be maintained and a satisfactory surface mounting ability can also be maintained.

A projecting amount of the pressure receiving surface and projection can be optionally set and therefore, a suitable biting amount can be easily set in accordance with the specifications of the spherical bump.

It is to be understood that the form of the invention herewith shown and described is to be taken as the preferred embodiment of the same, and that various changes in the shape, size and arrangement of parts may be resorted to without departing from the spirit of the invention or the scope of the subjoined claims.

What is claimed is:

1. A contacting structure for electrically contacting a spherical or semi-spherical bump having at least a part of a spherical surface with a lower-most point thereon, said contacting structure comprising:

a resilient support portion;

a contacting portion supported by said resilient support portion;

wherein said contacting portion includes a pair of pressure receiving plates having pressure receiving surfaces, respectively, and projections projecting from said pressure receiving surfaces, respectively;

wherein said pressure receiving surfaces face upwardly and inwardly toward one another so as to confront one another and diverge upwardly from one another;

wherein said contacting portion constitutes a means for contacting the spherical surface of the bump at locations symmetrically about the lower-most point of the spherical surface and excluding the lower-most point of the spherical surface;

wherein said projections constitute means for pressing into the spherical surface of the bump at the locations symmetrically about the lower-most point of the spherical surface and excluding the lower-most point of the spherical surface; and wherein said pressure receiving surfaces limit the amount by which said projections can press into the spherical surface of the bump by contacting against the spherical surface of the bump when said projections are pressed into the spherical surface of the bump a given amount.

2. A contacting structure as recited in claim 1, wherein said resilient support portion and said contacting portion together constitute at least a portion of a contact pin.

3. A contacting structure as recited in claim 2, wherein said contact pin further includes a male terminal projecting downwardly from said resilient support portion.

4. A contacting structure as recited in claim 2, wherein said contacting portion constitutes a means for contacting the spherical surface of the bump at locations diametrically opposed to one another relative to the lower-most point of the spherical surface.

5. A contacting structure as recited in claim 2, wherein said contacting portion constitutes a means for contacting the spherical surface of the bump at locations which are diametrically opposed to one another relative to the lower-most point of the spherical surface, and which are provided in a lower hemispherical portion of the spherical surface.

6. A contacting structure as recited in claim 1, wherein said contacting portion constitutes a means for contacting the spherical surface of the bump at locations diametrically opposed to one another relative to the lower-most point of the spherical surface.

7. A contacting structure as recited in claim 1, wherein said contacting portion constitutes a means for contacting the spherical surface of the bump at locations which are diametrically opposed to one another relative to the lower-most point of the spherical surface, and which are provided in a lower hemispherical portion of the spherical surface.

8. A contacting structure as recited in claim 1, wherein said projections comprise ribs extending longitudinally along said pressure receiving plates, respectively.

9. A contacting structure as recited in claim 8, wherein said ribs extend longitudinally along transverse centers of said pressure receiving plates, respectively.

10. A contacting structure as recited in claim 8, wherein said ribs diverge upwardly from one another.

11. A contacting structure as recited in claim 1, wherein said resilient support portion comprises a pair of resilient linear members confronting one another, said pressure receiving plates being supported by said resilient linear members, respectively.

12. A contacting structure as recited in claim 11, wherein said resilient linear members comprise resilient linear plates having plate surfaces respectively confronting one another.

13. A contacting structure as recited in claim 12, wherein said resilient linear plates are connected to one another at bottom ends thereof, and are otherwise spaced apart from one another.

14. A contacting structure as recited in claim 11, wherein said resilient linear members are connected to one another at bottom ends thereof, and are otherwise spaced apart from one another.

15. A contacting structure as recited in claim 1, wherein said pressure receiving plates are respectively discrete members.

* * * * *